United States Patent
Tawara et al.

(10) Patent No.: US 10,748,763 B2
(45) Date of Patent: Aug. 18, 2020

(54) SILICON CARBIDE SEMICONDUCTOR SUBSTRATE, METHOD OF MANUFACTURING A SILICON CARBIDE SEMICONDUCTOR DEVICE, AND SILICON CARBIDE SEMICONDUCTOR DEVICE

(71) Applicant: FUJI ELECTRIC CO., LTD., Kawasaki (JP)

(72) Inventors: Takeshi Tawara, Tsukuba (JP); Hidekazu Tsuchida, Yokosuka (JP); Tetsuya Miyazawa, Yokosuka (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 16/117,542

(22) Filed: Aug. 30, 2018

(65) Prior Publication Data

US 2019/0103271 A1  Apr. 4, 2019

(30) Foreign Application Priority Data

Sep. 29, 2017  (JP) ................. 2017-191966

(51) Int. Cl.
*H01L 29/16* (2006.01)
*H01L 21/02* (2006.01)
*H01L 29/167* (2006.01)

(52) U.S. Cl.
CPC .... *H01L 21/02576* (2013.01); *H01L 21/0262* (2013.01); *H01L 21/02378* (2013.01); *H01L 21/02433* (2013.01); *H01L 21/02529* (2013.01); *H01L 21/02581* (2013.01); *H01L 29/167* (2013.01); *H01L 21/02634* (2013.01); *H01L 29/1608* (2013.01)

(58) Field of Classification Search
CPC ............................ H01L 29/67; H01L 29/167
See application file for complete search history.

(56) References Cited

U.S. PATENT DOCUMENTS 6,329,088 B1    12/2001  Landini et al.
6,507,046 B2 *   1/2003  Mueller .................. C30B 23/00
                                                          257/77
6,964,917 B2 *  11/2005  Tsvetkov ................ C30B 31/00
                                                          438/512

(Continued)

FOREIGN PATENT DOCUMENTS

JP   2003-502857 A   1/2003
JP   2015-050436 A   3/2015
JP   2015-143168 A   8/2015

*Primary Examiner* — Ida M Soward

(57) ABSTRACT

An n⁻-type epitaxial layer is grown on a front surface of the silicon carbide substrate by a CVD method in a mixed gas atmosphere containing a source gas, a carrier gas, a doping gas, an additive gas, and a gas containing vanadium. The doping gas is nitrogen gas; and the gas containing vanadium is vanadium tetrachloride gas. In the mixed gas atmosphere, the vanadium bonds with the nitrogen, producing vanadium nitride, whereby the nitrogen concentration in the mixed gas atmosphere substantially decreases. As a result, the nitrogen taken in by the n⁻-type epitaxial layer decreases and the n⁻-type epitaxial layer including nitrogen and vanadium as dopants is grown having a low impurity concentration.

17 Claims, 6 Drawing Sheets

(56) References Cited

U.S. PATENT DOCUMENTS

| | | | |
|---|---|---|---|
| 7,391,058 B2* | 6/2008 | Rowland | H01L 21/02447 257/183 |
| 8,147,991 B2* | 4/2012 | Jenny | C30B 23/00 428/698 |
| 8,828,769 B2* | 9/2014 | Quick | H01L 21/4846 438/48 |
| 9,200,381 B2* | 12/2015 | Leonard | C30B 23/00 |
| 9,966,491 B2* | 5/2018 | Chandrashekhar | H01L 31/1105 |
| 10,453,924 B2* | 10/2019 | Tawara | H01L 21/0465 |
| 2004/0159865 A1* | 8/2004 | Allen | H01L 21/7605 257/280 |
| 2007/0292999 A1* | 12/2007 | Henning | H01L 29/1025 438/167 |
| 2014/0225472 A1* | 8/2014 | Guo | G21H 1/06 310/303 |
| 2016/0133461 A1* | 5/2016 | Janzen | H01L 21/02381 438/495 |
| 2016/0208414 A1 | 7/2016 | Odawara et al. | |
| 2017/0321345 A1* | 11/2017 | Xu | C01B 33/025 |
| 2018/0323263 A1* | 11/2018 | Tawara | H01L 21/02494 |

* cited by examiner

SILICON CARBIDE SEMICONDUCTOR SUBSTRATE, METHOD OF MANUFACTURING A SILICON CARBIDE SEMICONDUCTOR DEVICE, AND SILICON CARBIDE SEMICONDUCTOR DEVICE

CROSS REFERENCE TO RELATED APPLICATIONS

This application is based upon and claims the benefit of priority of the prior Japanese Patent Application No. 2017-191966, filed on Sep. 29, 2017, the entire contents of which are incorporated herein by reference.

BACKGROUND

1. Field

Embodiments of the invention relate to a silicon carbide semiconductor substrate, a method of manufacturing a silicon carbide semiconductor device, and a silicon carbide semiconductor device.

2. Description of Related Art

Silicon carbide (SiC) is chemically a very stable semiconductor material, has a wide bandgap of 3 eV, and can be used very stably as a semiconductor even at high temperatures. Silicon carbide has a critical electric field strength that is ten times that of silicon or greater, and is expected to be a semiconductor material that can sufficiently reduce ON-resistance. Therefore, semiconductor devices (hereinafter, silicon carbide semiconductor devices) that use silicon carbide are capable of withstanding high voltages and constitute various application-specific commercial products.

These silicon carbide semiconductor devices are fabricated (manufactured) using a silicon carbide epitaxial substrate in which an $n^-$-type epitaxial layer doped with an n-type impurity at a low impurity concentration is formed by epitaxial growth on a starting substrate (hereinafter, silicon carbide substrate) containing silicon carbide. To establish high breakdown voltages of 3 kV or higher, the $n^-$-type epitaxial layer has to have a low impurity concentration of about $1 \times 10^{14}/cm^3$ to $1 \times 10^{15}/cm^3$, a depletion layer in the $n^-$-type epitaxial layer has to sufficiently spread when the silicon carbide semiconductor device is OFF, and the critical electric field strength has to be reduced.

FIG. 5 is a cross-sectional view schematically depicting a conventional epitaxial growth process. A silicon carbide epitaxial substrate 110 is fabricated by thermally decomposing in a carrier gas, a source gas introduced into an epitaxial growth furnace (not depicted) and continuously depositing silicon (Si) atoms on a front surface of a silicon carbide substrate 101, along a crystal lattice of the silicon carbide substrate 101. At the front surface of the silicon carbide substrate 101, an $n^-$-type epitaxial layer 102 into which nitrogen (N) is introduced (doped) as a dopant is grown.

In general, in an introduced gas 103 that is introduced into the epitaxial growth furnace, a monosilane ($SiH_4$) gas and a propane ($C_3H_8$) gas are used as a source gas and hydrogen ($H_2$) gas is used as a carrier gas. Further, nitrogen ($N_2$) gas is used as a doping gas and hydrogen chloride (HCl) gas is suitably added as an additive gas. FIG. 5 depicts the silicon carbide substrate 101 as "n-sub" and the $n^-$-type epitaxial layer 102 as "$n^-$-epi".

As a method of forming a silicon carbide epitaxial layer on a silicon carbide substrate in this manner, a method of using a monosilane ($SiH_4$) gas and a methane ($CH_4$) gas as a dopant gas to form a silicon carbide epitaxial layer has been proposed (for example, refer to Published Japanese-Translation of PCT Application, Publication No. 2003-502857 (paragraphs 0043 to 0044)). In Published Japanese-Translation of PCT Application, Publication No. 2003-502857, another precursor containing silicon (Si) and carbon (C), phosphine ($PH_3$), diborane ($B_2H_6$), TMA (trimethylaluminum), and various precursors containing vanadium (V), etc. are used as a dopant.

Further, as a method of forming an $n^-$-type epitaxial layer having a low impurity concentration, a method of growing an $n^-$-type epitaxial layer under a condition that reduces the amount of nitrogen gas in the epitaxial growth furnace has been proposed (for example, refer to Japanese Laid-Open Patent Publication No. 2015-143168 (paragraphs 0067 to 0069)). In Japanese Laid-Open Patent Publication No. 2015-143168, a nitrogen concentration of a member constituting the epitaxial growth furnace or a flow rate of nitrogen gas introduced into the epitaxial growth furnace is adjusted, whereby the nitrogen that is taken in by the $n^-$-type epitaxial layer during epitaxial growth is reduced and thus, the nitrogen concentration of the $n^-$-type epitaxial layer is reduced.

Further, as another method of growing an $n^-$-type epitaxial layer having a low impurity concentration, a method has been proposed in which an epitaxial growth furnace is configured by a member from which nitrogen is desorbed by vacuum baking, whereby the amount of nitrogen gas released from the epitaxial growth furnace is reduced (for example, refer to Japanese Laid-Open Patent Publication No. 2015-050436 (paragraphs 0028 to 0029)). In Japanese Laid-Open Patent Publication No. 2015-050436, nitrogen is sufficiently desorbed from the replacement member of epitaxial growth furnace by vacuum baking and the member may be taken out into the atmosphere. Further, a dedicated vacuum baking furnace is used, the vacuum baking period is reduced, and an interval immediately after a member having a relatively clean member surface is replaced is used to grow an epitaxial layer.

SUMMARY

According to an embodiment of the present invention, a method of manufacturing a silicon carbide semiconductor device includes forming an n-type epitaxial layer containing silicon carbide and having a nitrogen concentration that is at most $1 \times 10^{15}/cm^3$ and a vanadium concentration that is lower than the nitrogen concentration, the n-type epitaxial layer being formed on a surface of a semiconductor substrate containing silicon carbide, by epitaxial growth in a mixed gas atmosphere containing a first gas that contains silicon, a second gas that contains carbon, a third gas that contains nitrogen and a fourth gas that contains vanadium.

In the embodiment, in the mixed gas atmosphere, a ratio of the fourth gas to the third gas is in a range of 1% to 10%.

In the embodiment, forming the n-type epitaxial layer includes forming the n-type epitaxial layer having a nitrogen concentration that is at most $5 \times 10^{14}/cm^3$ and a vanadium concentration that is at most $\frac{1}{10}$ of the nitrogen concentration.

In the embodiment, the fourth gas is vanadium tetrachloride gas.

In the embodiment, forming the n-type epitaxial layer includes forming the n-type epitaxial layer with the semiconductor substrate in a heated state at a temperature in a range of 1500 degrees C. to 1700 degrees C.

According to another embodiment of the present invention, a silicon carbide semiconductor substrate includes a semiconductor substrate made of silicon carbide; and an n-type epitaxial layer provided on a surface of the semiconductor substrate and made of silicon carbide, the n-type epitaxial layer containing nitrogen and vanadium. The n-type epitaxial layer has a nitrogen concentration that is at most $1 \times 10^{15}/cm^3$. The n-type epitaxial layer has a vanadium concentration that is lower than the nitrogen concentration of the n-type epitaxial layer.

In the embodiment, the vanadium concentration of the n-type epitaxial layer is at most 1/10 of the nitrogen concentration of the n-type epitaxial layer.

In the embodiment, the nitrogen concentration of the n-type epitaxial layer is at most $5 \times 10^{14}/cm^3$.

In the embodiment, the n-type epitaxial layer is provided on a (000-1) plane of the semiconductor substrate.

According to another embodiment of the present invention, a silicon carbide semiconductor device includes a semiconductor substrate made of silicon carbide; an n-type epitaxial layer provided on a front surface of the semiconductor substrate, the n-type epitaxial layer containing nitrogen and vanadium; a p-type region provided in a surface layer of the n-type epitaxial layer on a side of the n-type epitaxial layer facing toward the semiconductor substrate; a predetermined element structure constituted by the p-type region; a first electrode electrically connected with the p-type region; and a second electrode provided at a rear surface of the semiconductor substrate. The n-type epitaxial layer has a nitrogen concentration that is at most $1 \times 10^{15}/cm^3$. The n-type epitaxial layer has a vanadium concentration that is lower than the nitrogen concentration of the n-type epitaxial layer.

Objects, features, and advantages of the present invention are specifically set forth in or will become apparent from the following detailed description of the invention when read in conjunction with the accompanying drawings.

DESCRIPTION OF EMBODIMENTS

Figure 1:
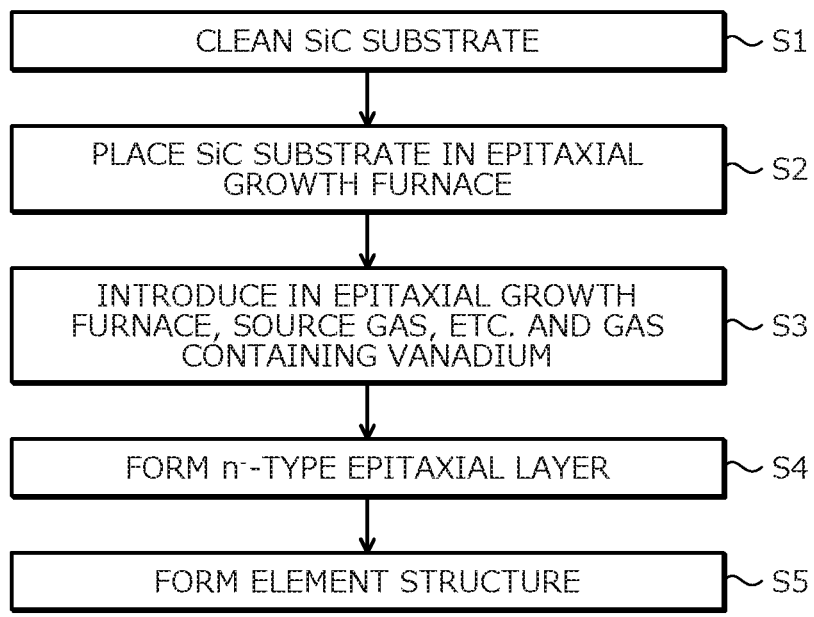
FIG. 1 is a flowchart of an outline of a method of manufacturing a silicon carbide semiconductor device according to an embodiment.

First, problems associated with the conventional techniques will be described. In the epitaxial growth of silicon carbide, in the environment (in the atmosphere and in the epitaxial growth furnace), an abundant amount of nitrogen becomes an n-type dopant. Therefore, even when a load-lock mechanism disposed in a vacuum chamber partitioned from the epitaxial growth furnace by a gate valve by an epitaxial growth furnace and the gate valve is used between the epitaxial growth furnace and the atmosphere so that the interior of the epitaxial growth furnace is not exposed to the atmosphere, the interior of the epitaxial growth furnace is exposed to the atmosphere during wafer transfer.

During wafer transfer, nitrogen contained in the atmosphere entering the epitaxial growth furnace and nitrogen contained in the introduced gas 103 are taken into the n⁻-type epitaxial layer 102 during epitaxial growth. Therefore, forming the n⁻-type epitaxial layer 102 to have a low n-type impurity concentration (nitrogen concentration) of about $1 \times 10^{14}/cm^3$ to $1 \times 10^{15}/cm^3$ is difficult. In the conventional method, to reduce the n-type impurity concentration of the n⁻-type epitaxial layer 102, the following two measures are taken.

The first measure is a method of vacuuming, after wafer transfer into the epitaxial growth furnace and before the epitaxial growth, the interior of the epitaxial growth furnace for a long period (e.g., 24 hours) instead of the usual 5 minutes, whereby nitrogen is discharged outside the epitaxial growth furnace, lowering the nitrogen concentration in the gas atmosphere. The second measure is a method of using an ultrapure (e.g., purity about 6N (=99.9999%) or 9N (=99.9999999%)) special source gas to reduce the nitrogen contained in the introduced gas 103.

Further, when the n-type impurity concentration of the n⁻-type epitaxial layer 102 is $5 \times 10^{14}/cm^3$ or less, during epitaxial growth of the n⁻-type epitaxial layer 102, nitrogen from a rear surface of the silicon carbide substrate 101 vaporizes and is released inside the epitaxial growth furnace. The nitrogen that is from the rear surface of the silicon carbide substrate 101 and that vaporizes and is released becomes a dopant of the n⁻-type epitaxial layer 102 and increases the n-type impurity concentration of the n⁻-type epitaxial layer 102 (auto-doping).

However, when vacuuming of the interior of the epitaxial growth furnace is performed for a longer period, problems arise in that throughput of epitaxial growth step decreases and cost increases. Further, even when an ultrapure special source gas is used, a problem arises in that cost increases.

Further, nitrogen is easily taken in at a (000-1) plane, a so-called C-face of silicon carbide. Therefore, when the n⁻-type epitaxial layer 102 having a low n-type impurity concentration is formed by epitaxial growth at the C-face of silicon carbide, the nitrogen concentration in the epitaxial growth furnace has to be further reduced as compared to a case in which the n⁻-type epitaxial layer 102 is formed by epitaxial growth at a (0001) plane of silicon carbide, a so-called Si-face.

Embodiments of a silicon carbide semiconductor substrate, a method of manufacturing a silicon carbide semiconductor device, and a silicon carbide semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described. Further, in the present description, when Miller indices are described, "−" means a bar added to an index immediately after the "−", and a negative index is expressed by prefixing "−" to the index.

Figure 2:
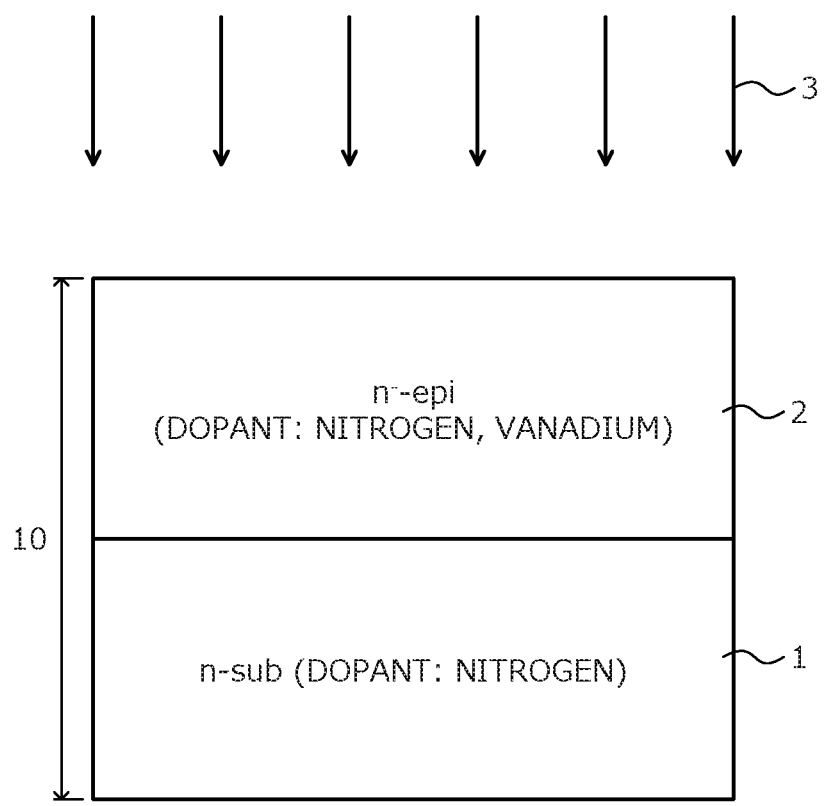
FIG. 2 is a cross-sectional view of the silicon carbide semiconductor device according to the embodiment during manufacture.

A method of manufacturing the silicon carbide semiconductor device according to the embodiment will be described. FIG. 1 is a flowchart of an outline of the method of manufacturing the silicon carbide semiconductor device according to the embodiment. FIG. 2 is a cross-sectional view of the silicon carbide semiconductor device according to the embodiment during manufacture. First, a starting substrate (n-type silicon carbide substrate (semiconductor wafer)) 1 containing silicon carbide is prepared, the silicon carbide substrate 1 is cleaned by a general semiconductor substrate cleaning method (organic cleaning method, RCA cleaning method) (step S1). Here, as an example, the n-type silicon carbide substrate 1 doped with, for example, nitrogen (N) as a dopant will be described (indicated in FIG. 2 as "n-sub").

A crystal structure of the silicon carbide substrate 1, for example, may be a 4-layer periodic hexagonal crystal structure (4H-SiC), or a 6-layer periodic hexagonal crystal structure (6H-SiC). A front surface (hereinafter, main surface where a later-described n$^-$-type epitaxial layer 2 is formed) of the silicon carbide substrate 1 may be a (0001) plane, a so-called Si-face, or a (000-1) plane, a so-called C-face. The silicon carbide substrate 1 may be, for example, a silicon carbide bulk substrate having a front surface that is a Si-face (or a C-face) that is tilted having an off-angle of, for example, about 4° with respect to the crystal axis.

Next, the silicon carbide substrate 1 is placed in an epitaxial growth furnace (chamber: not depicted) (step S2). The epitaxial growth furnace may be, for example, a thermal chemical vapor deposition (CVD) furnace. Next, a temperature in the epitaxial growth furnace is adjusted so that a temperature (substrate temperature) of the silicon carbide substrate 1 becomes a predetermined temperature suitable for epitaxial growth. Before the adjustment of the temperature of the epitaxial growth furnace, the front surface of the silicon carbide substrate 1 may be, for example, dry etched and cleaned in the epitaxial growth furnace, using a carrier gas described hereinafter.

Next, a source gas, a carrier gas, a doping gas and an additive gas, and a gas (fourth gas) containing vanadium (V) are concurrently introduced in the epitaxial growth furnace (step S3). At step S3, a gas (first gas) containing silicon (Si) and a gas (second gas) containing carbon (C) are introduced as the source gas. The gas containing silicon may be, for example, a monosilane (SiH$_4$) gas. The gas containing carbon may be, for example, a propane (C$_3$H$_8$) gas. Hydrogen (H$_2$) gas, for example, may be used as the carrier gas. A gas (third gas) containing nitrogen (N$_2$), for example, may be used as the doping gas. The gas containing nitrogen may be, for example, nitrogen gas. A gas containing chlorine (Cl) may be suitably added as the additive gas. The gas containing chlorine may be, for example, hydrogen chloride (HCl) gas.

Vanadium in the gas containing vanadium, similar to the nitrogen in the gas containing nitrogen, is doped into the n$^-$-type epitaxial layer 2 described hereinafter. In other words, the gas that includes vanadium is a dopant gas. For example, vanadium tetrachloride (VCl$_4$) gas may be used as the gas containing vanadium. In particular, for example, a gas pre-diluted (VCl$_4$/H$_2$) with hydrogen gas to have a vanadium tetrachloride concentration of 100 ppm may be used as the gas containing vanadium. The gas containing vanadium is supplied to the epitaxial growth furnace simultaneously with the source gas, etc. (source gas, carrier gas, doping gas and additive gas), from a gas cylinder through a pipe separate from, for example, the source gas, etc. Reference numeral 3 represents gas introduced into the epitaxial growth furnace and flows of the source gas, the carrier gas, the doping gas and the additive gas are collectively indicated by arrows.

Next, in a mixed gas atmosphere containing the source gas, the carrier gas, the doping gas, the additive gas, and the gas containing vanadium introduced at step S3, the n$^-$-type epitaxial layer 2 is grown on the front surface of the silicon carbide substrate 1 by a CVD method (step S4). At step S4, the n$^-$-type epitaxial layer 2 doped with nitrogen and vanadium as dopants is grown (indicated in FIG. 2 as "n$^-$-epi"). Introduction of the source gas, etc. and the gas containing vanadium in the epitaxial growth furnace enables an n-type impurity concentration of the n$^-$-type epitaxial layer 2 to be reduced.

At step S4, the n-type impurity concentration of the n$^-$-type epitaxial layer 2 may be reduced for the following reason. Gaseous species molar ratio present in the epitaxial growth furnace during the epitaxial growth of the n$^-$-type epitaxial layer 2 was calculated by heat balance calculation. Results confirm that vanadium in the mixed gas atmosphere (gas phase) bonds with nitrogen, producing vanadium nitride (VN). In general, at the time of epitaxial growth, the temperature in the epitaxial growth furnace is, for example, about 1500 degrees C. to 1700 degrees C., and at this temperature, vanadium nitride is substantially in the solid phase state (particles, etc.) and does not contribute as a dopant. In other words, vanadium bonds with nitrogen, forming vanadium nitride, whereby the nitrogen concentration of the mixed gas atmosphere is substantially reduced. Therefore, the n-type impurity concentration of the n$^-$-type epitaxial layer 2 is assumed to be reduced due to a decrease in the nitrogen taken in by the n$^-$-type epitaxial layer 2. The produced vanadium nitride is discharged out of the epitaxial growth furnace.

The nitrogen concentration (n-type impurity concentration) of the n$^-$-type epitaxial layer 2 may be, for example, about $1\times10^{15}/cm^3$ or less, and may be about $5\times10^{14}/cm^3$ or less. As a result, the breakdown voltage of the silicon carbide semiconductor device may a high voltage of 3 kV or higher. The breakdown voltage is a limit voltage at which no errant operation or damage of the element occurs. Further, when vanadium is introduced into the n$^-$-type epitaxial layer 2 in excess, the resistance of the n$^-$-type epitaxial layer 2 increases and the n$^-$-type epitaxial layer 2 demonstrates semi-insulating properties. Therefore, the vanadium concentration of the n$^-$-type epitaxial layer 2 is to be lower than the nitrogen concentration. As a result, an n-type polarity of the n$^-$-type epitaxial layer 2 is kept stable. The vanadium concentration of the n$^-$-type epitaxial layer 2 may be about 1/10 of the nitrogen concentration of the n$^-$-type epitaxial layer 2 or less. For the respective conditions of the nitrogen concentration and the vanadium concentration of the n$^-$-type epitaxial layer 2, a flow ratio of the gas containing vanadium to a flow rate of the gas containing nitrogen suffices to be, for example, about 1% to 10% (1%≤flow rate of gas containing vanadium/flow rate of gas containing nitrogen≤10%).

While not particularly limited hereto, for example, epitaxial growth conditions at step S4 are as follows. The temperature of the silicon carbide substrate 1 is 1600 degrees C. A pressure of the mixed gas atmosphere in the epitaxial growth furnace is 80 Torr. As an introduced gas 3 introduced in the epitaxial growth furnace, when a monosilane gas, a propane gas, hydrogen chloride gas, nitrogen gas and vanadium tetrachloride gas are used, flow rates of these gases are 100 sccm, 33 sccm, 1 sccm, 0.14 sccm, and 1 sccm, respectively. The flow ratio of the gas containing vanadium to the flow rate of the gas containing nitrogen may be verified and determined in advance to obtain a predetermined nitrogen concentration of the n⁻-type epitaxial layer 2.

By the processes up to here, the silicon carbide epitaxial substrate (epitaxial wafer) 10 in which the n⁻-type epitaxial layer 2 is stacked on the front surface of the silicon carbide substrate 1 is fabricated. In the silicon carbide epitaxial substrate 10, a predetermined element structure (not depicted) of the silicon carbide semiconductor device is formed (step S5). Thereafter, the epitaxial wafer is cut (diced) into individual chips, whereby the silicon carbide semiconductor device is completed.

The described method of manufacturing the silicon carbide semiconductor device according to the embodiment is applicable to, for example, a metal oxide semiconductor field effect transistor (MOSFET), an insulated gate bipolar transistor (IGBT), a p-intrinsic-n (pin) diode, Schottky barrier diode (SBD), and the like. In other words, at step S5, general element structures of these silicon carbide semiconductor devices are formed by a general method.

As described, according to the embodiment, in the epitaxial growth furnace, the gas containing vanadium is introduced in addition to the gas containing nitrogen as a dopant gas, whereby in the mixed gas atmosphere for forming the n⁻-type epitaxial layer by epitaxial growth, vanadium and nitrogen bond, producing vanadium nitride. As a result, the nitrogen concentration of the mixed gas atmosphere decreases, whereby the nitrogen taken in by the n⁻-type epitaxial layer decreases, enabling the nitrogen concentration (n-type impurity concentration) of the n⁻-type epitaxial layer to be reduced. Therefore, without having to vacuum the epitaxial growth furnace for a long period or use an ultrapure special source gas like the convention method, increases in cost may be prevented. Therefore, the n⁻-type epitaxial layer doped with nitrogen at a low impurity concentration may be formed at a low cost. Further, an inexpensive silicon carbide epitaxial substrate including the n⁻-type epitaxial layer having a low impurity concentration and an inexpensive silicon carbide semiconductor device using the silicon carbide epitaxial substrate may be provided.

Figure 3:
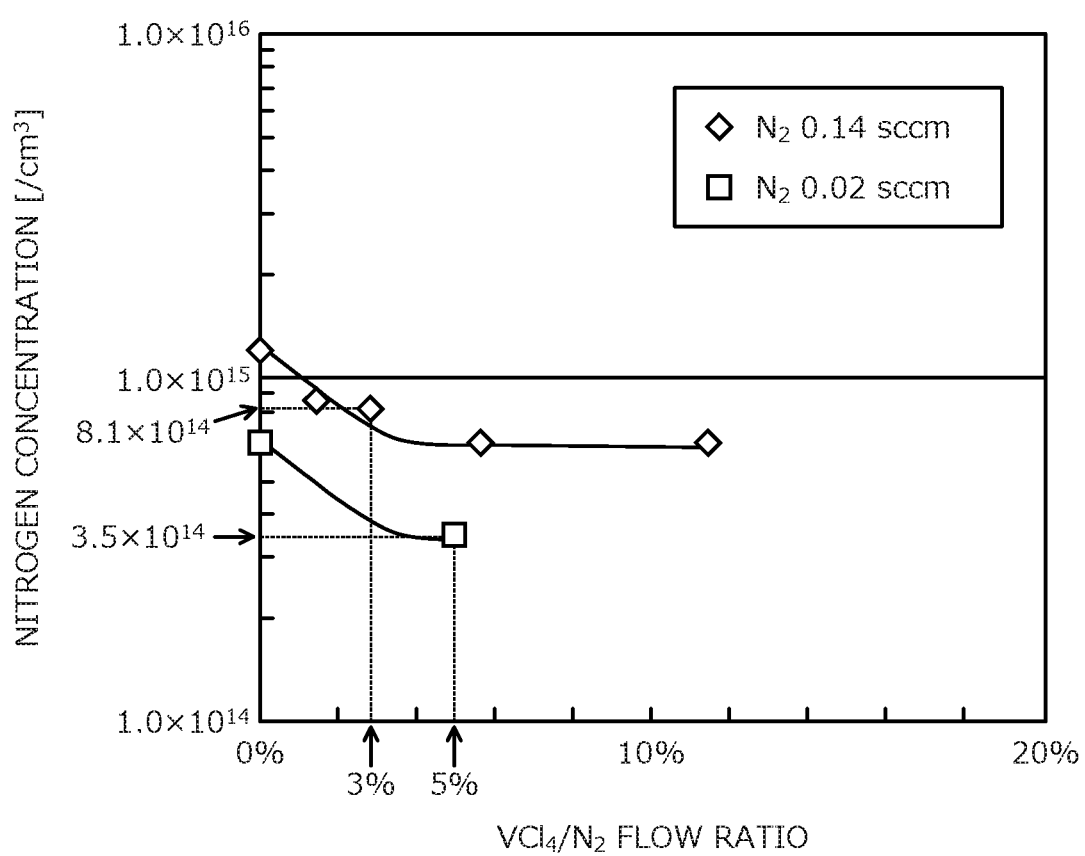
FIG. 3 is a characteristics diagram depicting a relationship of flow rate of a gas containing vanadium and nitrogen concentration of an n⁻-type epitaxial layer.
Figure 4:
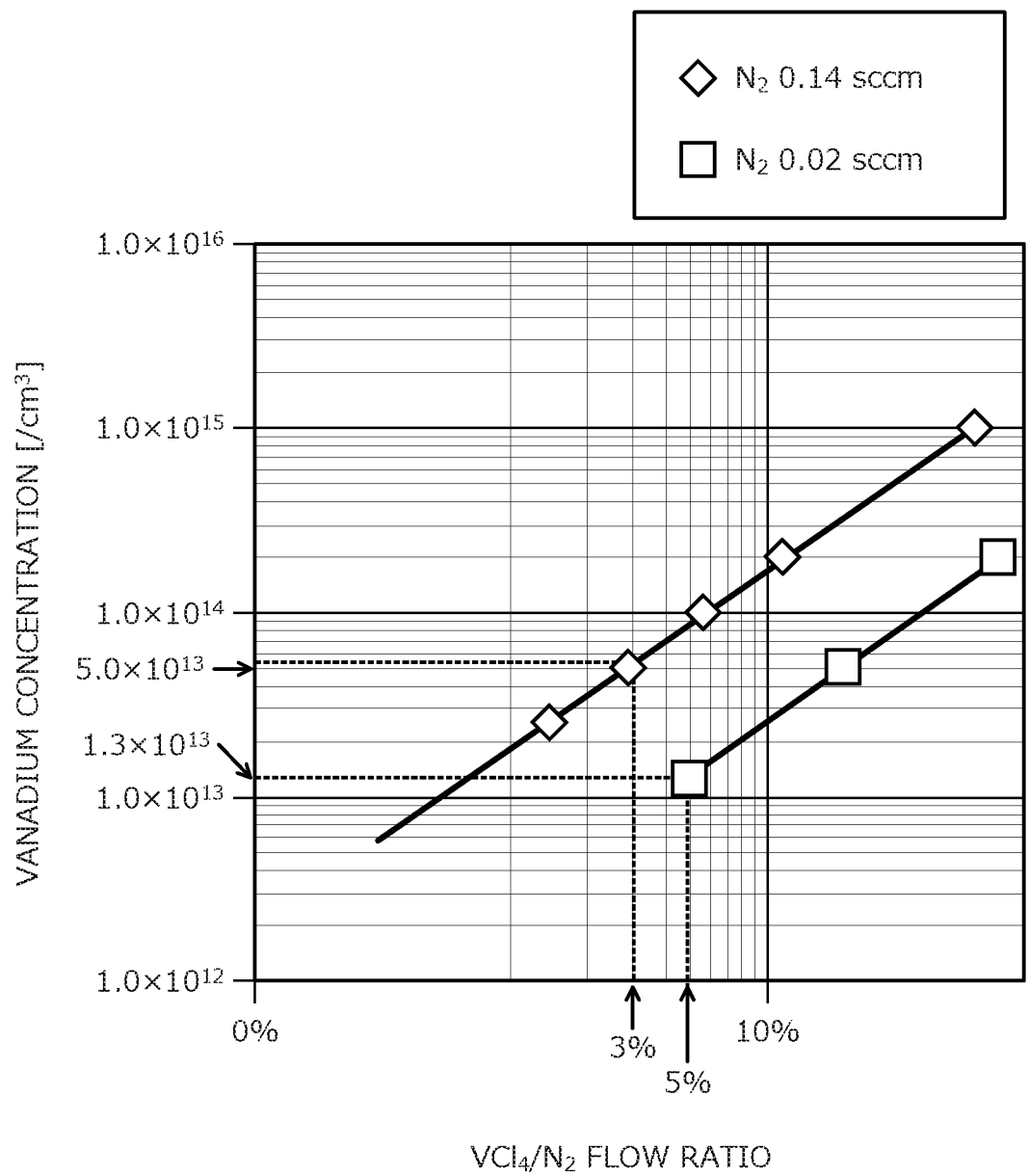
FIG. 4 is a characteristics diagram depicting a relationship of the flow rate of the gas containing vanadium and vanadium concentration of the n⁻-type epitaxial layer.
Figure 5:
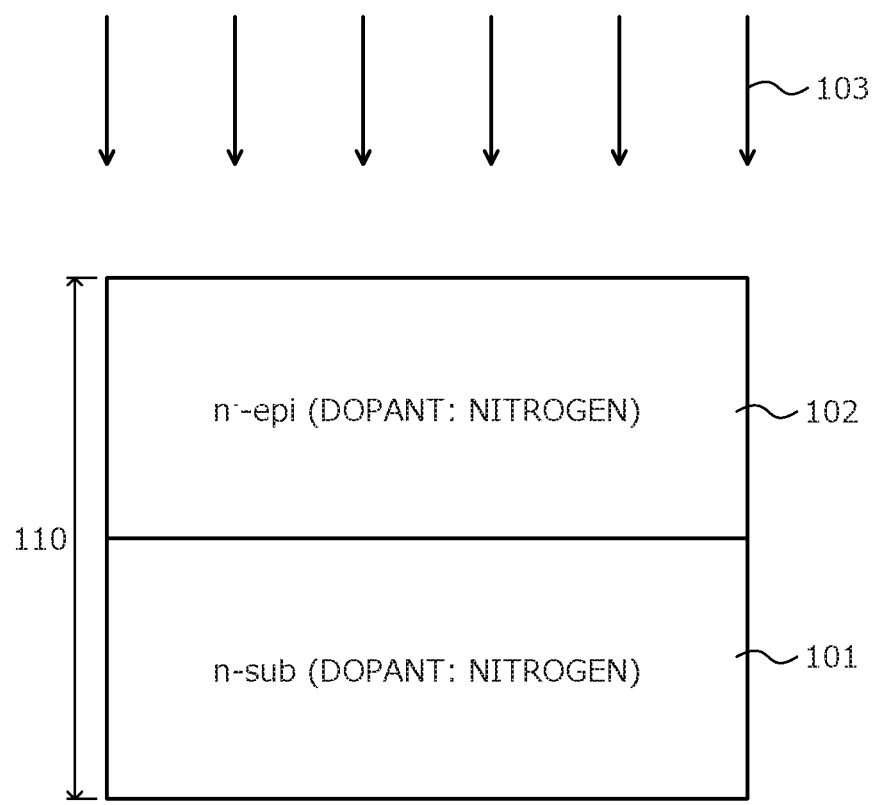
FIG. 5 is a cross-sectional view schematically depicting a conventional epitaxial growth process.

The relationship of the flow rate of the gas containing vanadium introduced in epitaxial growth furnace during epitaxial growth at step S4 and, the nitrogen concentration (n-type impurity concentration) and the vanadium concentration of the n⁻-type epitaxial layer 2 formed by the epitaxial growth at step S4 was verified. FIG. 3 is a characteristics diagram depicting the relationship of the flow rate of the gas containing vanadium and the nitrogen concentration of the n⁻-type epitaxial layer. FIG. 4 is a characteristics diagram depicting the relationship of the flow rate of the gas containing vanadium and the vanadium concentration of the n⁻-type epitaxial layer. As the dopant gas, vanadium tetrachloride gas was used for the gas containing vanadium and nitrogen gas was used for the gas containing nitrogen.

In FIGS. 3, 4, the horizontal axis represents the flow ratio (hereinafter, VCl₄/N₂ flow ratio (=flow rate of VCl₄ gas/flowrate of N₂ gas)) of the vanadium tetrachloride to the flow rate of the nitrogen gas introduced in epitaxial growth furnace. The flow rate of the N₂ gas was fixed at 0.14 sccm or 0.02 sccm while the flow rate of the VCl₄ gas was varied. Conditions other than the flow rate of the VCl₄ gas during the epitaxial growth at step S4 were the conditions exemplified in the embodiment. In FIG. 3, the vertical axis represents the nitrogen concentration of the n⁻-type epitaxial layer 2 calculated based on dependence of an applied voltage V and depletion layer capacitance C of the n⁻-type epitaxial layer 2. In FIG. 4, the vertical axis represents the vanadium concentration of the n⁻-type epitaxial layer 2 measured by secondary ion mass spectrometry (SIMS).

The results depicted in FIG. 3 confirmed that the introduction of the gas containing vanadium in the epitaxial growth furnace in addition to nitrogen gas enabled the nitrogen concentration of the n⁻-type epitaxial layer 2 to be reduced as compared to a case in which the gas containing vanadium is not introduced (VCl₄/N₂ flow ratio=0%). Further, it was confirmed that when the flow ratio of vanadium tetrachloride with respect to the flow rate of nitrogen gas is increased to about 10% (VCl₄/N₂ flow ratio=10%), decreases in the nitrogen concentration of the n⁻-type epitaxial layer 2 become saturated. Measurement results of the vanadium concentration of the n⁻-type epitaxial layer 2 at this time are depicted in FIG. 4.

When the flow rate of the N₂ gas was 0.14 sccm and the gas containing vanadium was not introduced (VCl₄/N₂ flow ratio=0%), the nitrogen concentration of the n⁻-type epitaxial layer 2 was about $1.2 \times 10^{15}$/cm³. On the other hand, when the flow rate of the N₂ gas was 0.14 sccm and the VCl₄/N₂ flow ratio was increased to 3%, the nitrogen concentration of the n⁻-type epitaxial layer 2 was confirmed to decrease to about $8.1 \times 10^{14}$/cm³ (refer to FIG. 3). Further, from the results depicted in FIG. 4, for the condition of the flow rate of the N₂ gas being 0.14 sccm and VCl₄/N₂ flow ratio being about 3%, the vanadium concentration of the n⁻-type epitaxial layer 2 was confirmed to be about $5.0 \times 10^{13}$/cm³, $1/10$ of the nitrogen concentration of the n⁻-type epitaxial layer 2 or less (=$5.0 \times 10^{13}/8.1 \times 10^{14}$).

Further, when the flow rate of the N₂ gas was 0.02 sccm and the gas containing vanadium was not introduced (VCl₄/N₂ flow ratio=0%), the nitrogen concentration of the n⁻-type epitaxial layer 2 was about $6.5 \times 10^{14}$/cm³. On the other hand, when the flow rate of the N₂ gas was 0.02 sccm and the VCl₄/N₂ flow ratio was increased to 5%, the nitrogen concentration of the n⁻-type epitaxial layer 2 was confirmed to decrease to about $3.5 \times 10^{14}$/cm³ (refer to FIG. 3). From the results depicted in FIG. 4, for the condition of the flow rate of the N₂ gas being 0.02 sccm and the VCl₄/N₂ flow ratio being about 5%, the vanadium concentration of the n⁻-type epitaxial layer 2 was confirmed to be about $1.3 \times 10^{13}$/cm³, $1/10$ of the nitrogen concentration of the n⁻-type epitaxial layer 2 or less (=$1.3 \times 10^{13}/3.5 \times 10^{14}$). Further, it was found that by reducing the flow rate of the N₂ gas, the n⁻-type epitaxial layer 2 having the described favorable nitrogen concentration is obtained.

According to the method of manufacturing a silicon carbide semiconductor device according to the embodiments of the present invention, vanadium density taken in by the epitaxial layer may be kept to a minimum while the doping density may be significantly reduced. This is enabled not by the doping density being reduced dependent on the vanadium taken in by the epitaxial layer but rather by effective removal of nitrogen (N) in the source gas by the formation of vanadium nitride (VN (solid phase)) in the gas phase.

The present invention is not limited to the described embodiments and various modifications within a range not departing from the spirit of the invention are possible.

The method of manufacturing a silicon carbide semiconductor device according to the embodiments of the present invention bonds vanadium and nitrogen in the mixed gas atmosphere, thereby producing vanadium nitride and enabling the nitrogen concentration of the mixed gas atmosphere to be substantially reduced and the nitrogen taken in by the n-type epitaxial layer to be decreased.

The method of manufacturing a silicon carbide semiconductor device according to the embodiments of the present invention achieves an effect in that an epitaxial layer having a low impurity concentration may be formed easily and at a low cost. Further, the silicon carbide semiconductor substrate and the silicon carbide semiconductor device according to the embodiments of the present invention achieve an effect in that a low-cost silicon carbide semiconductor substrate and silicon carbide semiconductor device including the epitaxial layer having a low impurity concentration may be provided.

Figure 6:
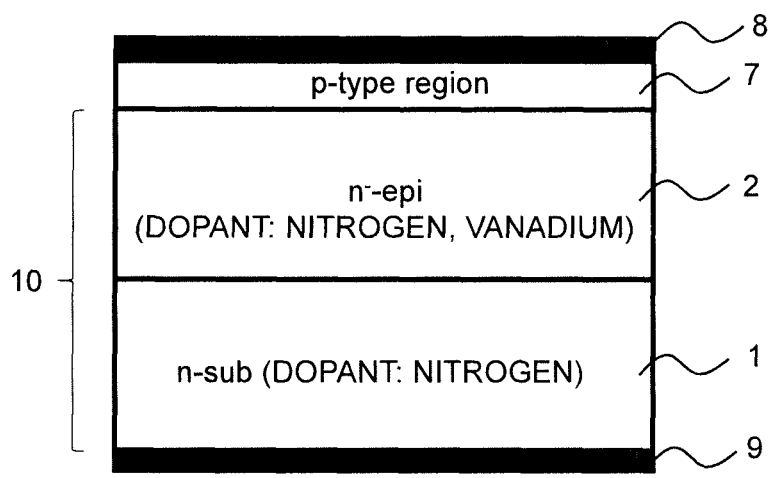
FIG. 6 is a cross-sectional view of the silicon carbide semiconductor device according to an embodiment.

FIG. 6 is a cross-sectional view of the silicon carbide semiconductor device according to an embodiment. In FIG. 6, the silicon carbide semiconductor device includes a semiconductor substrate made 1 of silicon carbide, and an n-type epitaxial layer 2 provided on a front surface of the semiconductor substrate 1, the n-type epitaxial layer 2 containing nitrogen and vanadium. The silicon carbide semiconductor device further includes a p-type region 7 provided in a surface layer of the n-type epitaxial layer 2 on a side of the n-type epitaxial layer 2 facing toward the semiconductor substrate 1, a first electrode 8 electrically connected with the p-type region 7, and a second electrode 9 provided at a rear surface of the semiconductor substrate 1.

As described, the silicon carbide semiconductor substrate, the method of manufacturing a silicon carbide semiconductor device, and the silicon carbide semiconductor device according to the present invention are useful for high-voltage silicon carbide semiconductor devices of 3 kV or higher, and is particularly suitable for silicon carbide semiconductor devices having an n⁻-type epitaxial layer at a C-face of silicon carbide.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A method of manufacturing a silicon carbide semiconductor device, comprising:
   forming an n-type epitaxial layer containing silicon carbide, having a nitrogen concentration that is at most $1\times10^{15}/cm^3$ and a vanadium concentration that is lower than the nitrogen concentration, and having a uniform impurity concentration distribution in a depth direction of the n-type epitaxial layer, the n-type epitaxial layer being formed on a surface of a semiconductor substrate containing silicon carbide, by epitaxial growth in a mixed gas atmosphere containing a first gas that contains silicon, a second gas that contains carbon, a third gas that contains nitrogen and a fourth gas that contains vanadium.

2. The method of manufacturing a silicon carbide semiconductor device according to claim 1, wherein
   in the mixed gas atmosphere, a ratio of the fourth gas to the third gas is in a range of 1% to 10%.

3. The method of manufacturing a silicon carbide semiconductor device according to claim 1, wherein
   forming the n-type epitaxial layer includes forming the n-type epitaxial layer having a nitrogen concentration that is at most $5\times10^{14}/cm^3$ and a vanadium concentration that is at most ⅒ of the nitrogen concentration.

4. The method of manufacturing a silicon carbide semiconductor device according to claim 1, wherein
   the fourth gas is vanadium tetrachloride gas.

5. The method of manufacturing a silicon carbide semiconductor device according to claim 1, wherein
   forming the n-type epitaxial layer includes forming the n-type epitaxial layer with the semiconductor substrate in a heated state at a temperature in a range of 1500 degrees C. to 1700 degrees C.

6. A silicon carbide semiconductor substrate, comprising:
   a semiconductor substrate made of silicon carbide; and
   an n-type epitaxial layer provided on a surface of the semiconductor substrate and made of silicon carbide, the n-type epitaxial layer containing nitrogen and vanadium, and having a uniform impurity concentration distribution in a depth direction of the n-type epitaxial layer, wherein
   the n-type epitaxial layer has a nitrogen concentration that is at most $1\times10^{15}/cm^3$, and
   the n-type epitaxial layer has a vanadium concentration that is lower than the nitrogen concentration of the n-type epitaxial layer.

7. The silicon carbide semiconductor substrate according to claim 6, wherein
   the vanadium concentration of the n-type epitaxial layer is at most ⅒ of the nitrogen concentration of the n-type epitaxial layer.

8. The silicon carbide semiconductor substrate according to claim 6, wherein
   the nitrogen concentration of the n-type epitaxial layer is at most $5\times10^{14}/cm^3$.

9. The silicon carbide semiconductor substrate according to claim 6, wherein
   the n-type epitaxial layer is provided on a plane of the semiconductor substrate.

10. The silicon carbide semiconductor substrate according to claim 6, wherein the n-type epitaxial layer is formed having been grown by concurrently introducing into an epitaxial growth furnace a source gas, a carrier gas, a first doping gas containing nitrogen, a second doping gas containing vanadium, and an additive gas, wherein a flow rate of the second dopant gas containing vanadium to the first dopant gas containing nitrogen which are concurrently introduced into the epitaxial growth furnace, is between one and ten percent.

11. The silicon carbide semiconductor substrate according to claim 10, wherein
   the flow rate of the first dopant gas containing nitrogen introduced into the epitaxial growth furnace, is between 0.02 sccm and 0.14 sccm.

12. The silicon carbide semiconductor substrate according to claim 10, wherein the flow rate of the second dopant gas containing vanadium to the first dopant gas containing nitrogen introduced into the epitaxial growth furnace, is between three and five percent.

13. The silicon carbide semiconductor substrate according to claim 10, wherein the second dopant gas containing vanadium includes vanadium tetrachloride.

14. The silicon carbide semiconductor substrate according to claim 10, wherein the second dopant gas containing vanadium includes a gas pre-diluted with hydrogen having a vanadium tetrachloride concentration of 100 ppm.

15. The silicon carbide semiconductor substrate according to claim 10, wherein
   the source gas contains at least one of silicon or carbon,
   the carrier gas includes hydrogen gas, and
   the additive gas contains chlorine.

16. The silicon carbide semiconductor substrate according to claim 15, wherein the source gas containing silicon includes monosilane gas and the source gas containing carbon includes propane gas, and the additive gas containing chlorine includes hydrogen chloride gas.

17. A silicon carbide semiconductor device comprising:

a semiconductor substrate made of silicon carbide;

an n-type epitaxial layer provided on a front surface of the semiconductor substrate, the n-type epitaxial layer containing nitrogen and vanadium, and having a uniform impurity concentration distribution in a depth direction of the n-type epitaxial layer,;

a p-type region provided in a surface layer of the n-type epitaxial layer on a side of the n-type epitaxial layer facing toward the semiconductor substrate;

a first electrode electrically connected with the p-type region; and a second electrode provided at a rear surface of the semiconductor substrate, wherein the n-type epitaxial layer has a nitrogen concentration that is at most $1 \times 10^{15}/cm^3$, and the n-type epitaxial layer has a vanadium concentration that is lower than the nitrogen concentration of the n-type epitaxial layer.

* * * * *